United States Patent [19]

Hadwin et al.

[11] Patent Number: 4,739,259

[45] Date of Patent: Apr. 19, 1988

[54] TELESCOPING PIN PROBE

[75] Inventors: Matthew J. Hadwin, Battleground; John D. Garcia, Vancouver, both of Wash.; Emory J. Harry, Aloha, Oreg.

[73] Assignee: Tektronix, Inc., Beaverton, Oreg.

[21] Appl. No.: 891,834

[22] Filed: Aug. 1, 1986

[51] Int. Cl.[4] .............................................. G01R 1/073
[52] U.S. Cl. ................................ 324/158 P; 324/72.5; 324/73 PC; 439/620
[58] Field of Search ............... 324/72.5, 73 PC, 158 P, 324/149; 339/DIG. 3; 439/620

[56] References Cited

U.S. PATENT DOCUMENTS

| | | | |
|---|---|---|---|
| 2,849,681 | 8/1958 | Belart | 324/72.5 X |
| 2,883,619 | 8/1959 | Kobbe et al. | 324/72.5 |
| 3,870,978 | 3/1975 | Dreyer | 339/DIG. 3 X |
| 4,051,432 | 9/1977 | Sarjeant | 324/72.5 |
| 4,138,643 | 2/1979 | Beck et al. | 324/158 F |
| 4,210,863 | 7/1980 | Hunt et al. | 324/72.5 |
| 4,252,990 | 2/1981 | Sado | 339/DIG. 3 X |
| 4,418,314 | 11/1983 | Nieto, Jr. | 324/72.5 |

FOREIGN PATENT DOCUMENTS 177809 4/1986 European Pat. Off. ......... 324/158 P

*Primary Examiner*—Reinhard J. Eisenzopf
*Assistant Examiner*—Stephen M. Baker
*Attorney, Agent, or Firm*—William O. Geny; George T. Noe

[57] ABSTRACT

A probe for use in electrical circuit test equipment, in which a contact element is longitudinally slidable in an insulator sleeve which also contains an R-C attenuator circuit connected electrically to the contact element by an electrically conductive elastomeric material. A high impedance cable is connected electrically to the other end of the RC attenuator circuit by another piece of conductive elastomeric material. The cable connects the attenuator to another R-C circuit which, together with the attenuator, forms a voltage divider, and the attenuated signal controls an amplifier which provides a signal through a low impedance cable to a test equipment.

11 Claims, 2 Drawing Sheets

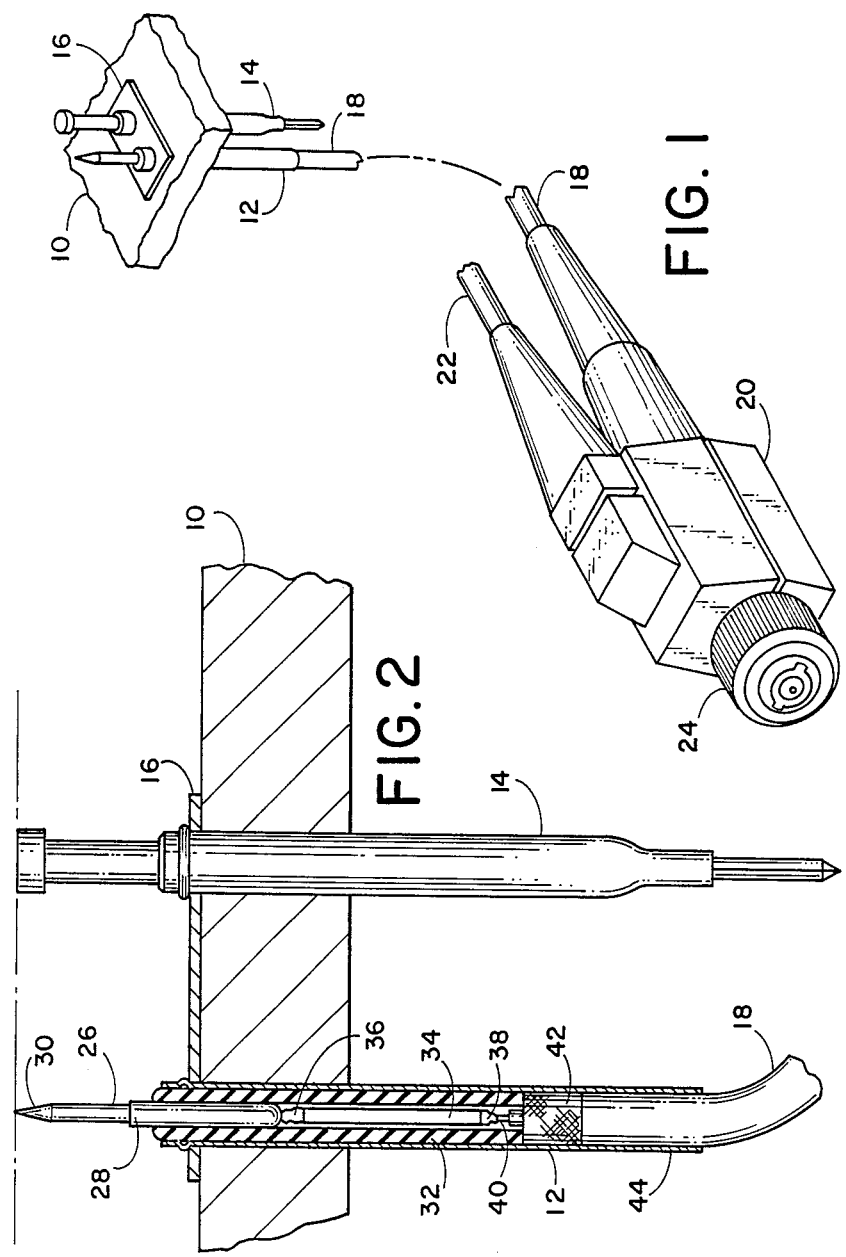

TELESCOPING PIN PROBE

The following invention relates to a spring loaded, telescoping electrical contact pin probe having a high input impedance and a wide band frequency response characteristic which can be mounted on a conventional "bed of nails" test fixture.

Telescoping pin probes are commonly in use as test probes for printed circuits or other components. A telescoping pin is a telescoping rod mounted in a spring loaded sleeve and having a contact point for touching various desired locations on a printed circuit board. Often a number of telescoping pins are placed in a test fixture in an array or matrix. Such fixtures are commonly known in the industry as "bed of nails" test fixtures because of the use of a plurality of conical tipped probes held upright in the test fixture and placed relatively close together. A device under test such as a printed circuit board is placed in a chuck and lowered onto the test fixture until the probes make contact with the desired points on the circuit. The probes are connected by cables or transmission lines to a test instrument which then performs a series of diagnostic tests.

Most probes of this type are DC, uncontrolled impedance probes. The pencil-thin shape of such probes, which allows them to be placed in test fixtures of the type described above, prevents the use of active circuitry near the tip of the probe. Active probes have been available only in hand-held units which are considerably bulkier than the telescoping pin probes used in a test fixture. Therefore, the previously available test fixture probes are capable only of DC or very low frequency measurement and also have a low impedance input characteristic which may place undesirable loads on the circuit under test.

SUMMARY OF THE INVENTION

The present invention comprises a telescoping pin probe including a telescoping pin which is held within an insulating sleeve, and a circuit element, also held within the sleeve and electrically connected to the telescoping pin. The circuit element is connected to a transmission line which is connected to an auxiliary electrical circuit for providing the telescoping pin with a high input impedance and a wide band frequency response characteristic.

The telescoping pin probe of the invention may utilize a thin, elongate thick film technology circuit mounted on a substrate and having an input at one end of the substrate and an output at the opposite end. Electrical contact between the telescoping pin and the thick film technology circuit, and between the thick film technology circuit and the transmission line is provided by conductive elastomers affixed to the input and output ends of the thick film technology integrated circuit. The entire assembly may be fitted within an outer conductive sleeve which may be placed within a conventional telescoping pin test fixture.

In order to provide a ground connection, the outer sleeve may be connected to a ground plane, and the ground plane may, in turn, be connected to another telescoping pin which makes contact with a region of ground potential in the device under test.

It is a primary object of this invention to provide a telescoping pin probe having a characteristically high impedance and wide bandwidth frequency response and yet capable of being located within a conventional telescoping pin test fixture.

The foregoing and other objectives, features and advantages of the present invention will be more readily understood upon consideration of the following detailed description of the invention taken in conjunction with the accompanying drawings.

BRIEF DESCRIPTION OF THE DRAWINGS

FIG. 1 is a perspective view of a telescoping pin probe constructed according to the present invention mounted in a test fixture and connected to a compensation circuit box suitable for connection to an electronic test instrument.

FIG. 2 is a partially sectional side view of the telescoping pin probe situated in the test fixture shown in FIG. 1.

DETAILED DESCRIPTION OF THE INVENTION

Figure 3:
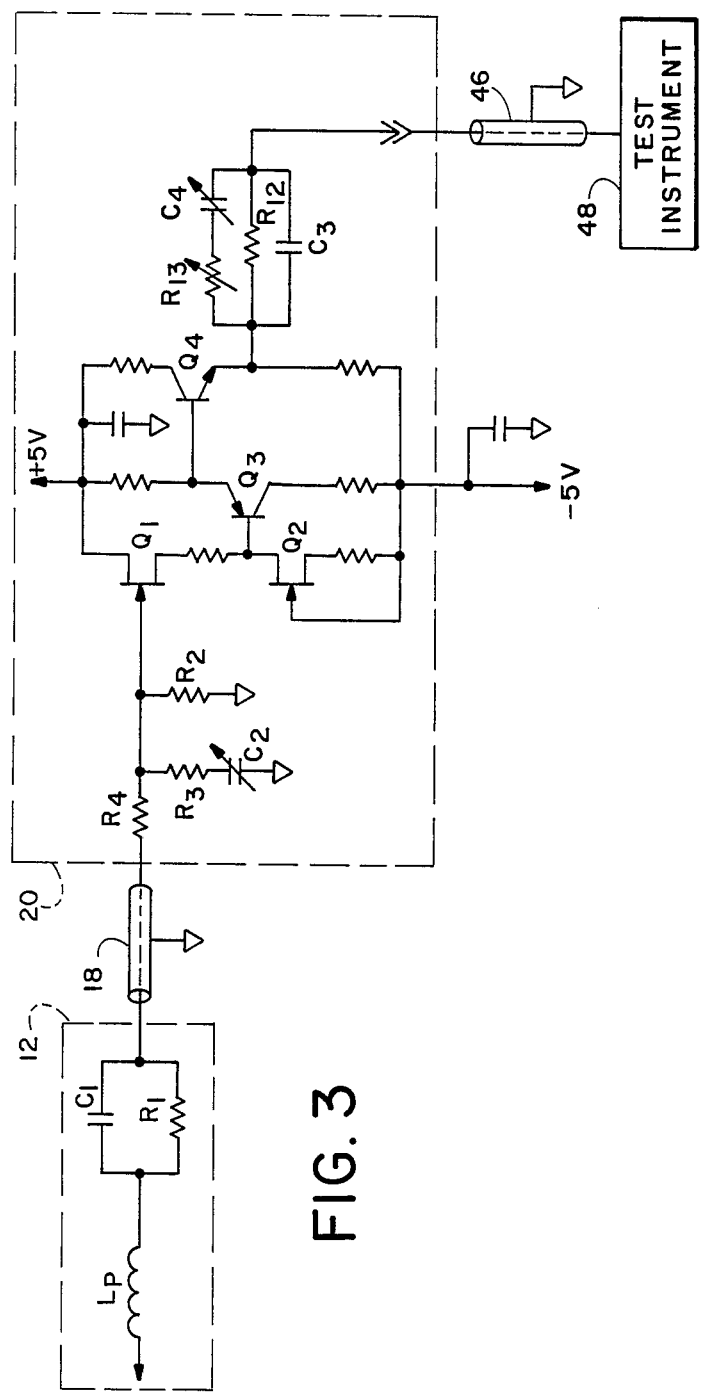
FIG. 3 shows a schematic circuit diagram illustrating a circuit which is used in conjunction with the probe of FIGS. 1 and 2.

Referring to FIG. 1, a test fixture 10 includes a telescoping pin probe 12 and a ground probe 14. The ground probe 14 is connected to the telescoping pin probe 12 by a ground plane 16 which is situated on the surface of the test fixture 10. A coaxial cable 18 serves as a transmission line to connect the telescoping pin probe 12 to a compensation box 20 which houses active circuitry for providing the telescoping pin probe 12 with the required electrical characteristics. The compensation box 20 is powered by a power input line 22 which may be connected to any suitable power supply. The compensation box 20 includes a BNC connector 24 for connecting the compensation box 20 to the input of an electronic test instrument.

Referring to FIG. 2, the telescoping pin probe 12 includes a telescoping pin 26 comprising a spring loaded sheath 28 and a sharpened contact point 30. The telescoping pin 26 is held inside an insulator 32. A circuit element 34 which may be an RC attenuator is also held within insulating sleeve 32 and is connected to the spring loaded sheath 28 of the telescoping pin 26 by a small wad of conductive elastomer 36. The output of the circuit element 34 is connected by another small wad of conductive elastomer 38 to the signal path 40 of a transmission line 18. The transmission line 18 also includes a coaxial ground shield 42 which is brought into electrical contact with a metal receptacle 44 held within the test fixture 10. The metal receptacle 44 is connected to a ground plane 16 which is in turn connected to ground telescoping pin 14.

The circuit element 34 may be a thick film technology circuit printed on a thin elongate piece of alumina substrate. The circuit 34 may comprise a resistor $R_1$ and capacitor $C_1$ connected in parallel, which combine with the impedance provided by coaxial cable 18 and the circuit elements in active compensation box 20 to give the probe its characteristically high impedance and wide bandwidth frequency response. The telescoping pin 12 has a characteristically inductive tip as shown by inductor $L_p$. The circuit element 34 reduces the signal level encountered at the probe tip, acting as one half of a voltage divider. The other half of the voltage divider comprises a variable capacitor $C_2$ and resistor $R_2$. The two aforementioned portions of the voltage divider are linked by a high impedance cable 18 which has a nominal impedance of 120 ohms. The signal conductor of the cable 18 terminates in a damping resistor R4 and in a compensating peaking resistor R3. The voltage divider output is applied to the gate of high input impedance FET Q1. Q2 provides a current source for Q1 and thermally compensates for the heating of the FETS Q1 and Q2. The current gain of the attenuated probe tip signal is provided by Q4. Thermal compensation for Q4 is provided by Q3. The output of the amplifier comprising Q1, Q2, Q3 and Q4 is connected to a back termination network comprising R12, a 50 ohm resistor, connected in parallel with R13 and C4 in one branch and C3 in another branch. R13 and C4 compensate for skin effect losses which may occur in 50 ohm transmission line 46 at high frequencies. C3 provides a high frequency bypass to sharpen the leading edges of signal pulses to compensate for the initial capacitance presented by cable 46.

Cable 46 is a standard 50 ohm cable which is connected to a test instrument 48. With the circuitry contained in compensation box 20, the test instrument 48 need not be connected directly to the compensation box 20 but may be located remotely from it and connected by a cable 46. Thus, the transmission line 18, whose impedance must be high in order for the attenuator located on circuit element 34 to function properly, is long enough to provide ample clearance for the probe 12 so that it may be located in the test fixture 10. The transmission line 22 does not, however, provide the link by which the compensation box 20 is connected to the test instrument. Rather, it is the back termination network that provides the compensation box 20 with the capability of driving the conventional 50 ohm cable 46, which may be of any arbitrary length.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A telescoping pin probe mounted in a multi-pin test fixture comprising:
   (a) an insulating sleeve
   (b) a telescoping pin positioned partially within said insulating sleeve, for making electrical contact with a circuit under test;
   (c) circuit element means having two portions, including a passive portion having a predetermined impedance supported on a thin, elongate substrate situated within said insulation sleeve, and connected to said telescoping pin by a conductive elastomer, and an active portion having circuit elements for providing, in cooperation with said passive portion, a high input impedance and a wide bandwidth frequency response; and
   (e) transmission line means for coupling said active portion of said circuit element means to said passive portion of said circuit element means, said transmission line means having one end electrically connected to said passive portion of said circuit element means through a conductive elastomer and having another end electrically connected to said active portion of said circuit element means, wherein said active portion of said circuit element means is remotely located from said multi-pin test fixture.

2. The probe of claim 1, further including a conductive sheath disposed about said insulating sleeve for connection to a ground plane in said multi-pin test fixture.

3. The probe of claim 2 wherein said conductive sheath is affixed to a base plate for holding said probe in a predetermined position relative to a device under test.

4. The probe of claim 3 wherein said conductive sheath is connected to a ground plane situated on said base plate, and said ground plane is connected to a ground probe for making contact with a region of ground potential on said device under test.

5. The probe of claim 1 wherein said circuit element means comprises a voltage divider forming an input to an amplifier for driving a back termination network.

6. The probe of claim 5 wherein said passive portion of said circuit element means comprises a first portion of said voltage divider for attenuating a signal sensed at the tip of said telescoping pin.

7. The probe of claim 6 wherein said transmission line is configured to provide a predetermined inductive reactance for said circuit element means.

8. The probe of claim 6 wherein said passive portion of said circuit element means comprises a resistor and a capacitor connected in parallel.

9. A telescoping pin probe mounted in a multi-pin test fixture comprising:
   (a) an insulating sleeve;
   (b) a contact pin held partially within said insulating sleeve so as to project outwardly therefrom;
   (c) first circuit means held within said insulating sleeve and electrically connected to said contact pin, said first circuit means comprising a first portion of a voltage divider;
   (d) second circuit means comprising a second portion of a voltage divider;
   (e) a high impedance transmission line electrically connecting said first and second circuit means; and
   (f) an amplifier termination network electrically connected to second circuit means to drive a low impedance transmission line.

10. The probe of claim 9 wherein said first circuit means is a thick film technology circuit printed on a thin elongate substrate.

11. The probe of claim 10 wherein said first circuit means comprises a resistor and capacitor connected in parallel.

* * * * *